(12) United States Patent
Ueno

(10) Patent No.: US 10,876,704 B2
(45) Date of Patent: Dec. 29, 2020

(54) VEHICULAR LUMINAIRE AND VEHICULAR LAMP

(71) Applicant: Toshiba Lighting & Technology Corporation, Yokosuka (JP)

(72) Inventor: Misaki Ueno, Yokosuka (JP)

(73) Assignee: Toshiba Lighting & Technology Corporation, Yokosuka (JP)

(*) Notice: Subject to any disclaimer, the term of this patent is extended or adjusted under 35 U.S.C. 154(b) by 0 days.

(21) Appl. No.: 16/538,021

(22) Filed: Aug. 12, 2019

(65) Prior Publication Data

US 2020/0182432 A1 Jun. 11, 2020

(30) Foreign Application Priority Data

Dec. 5, 2018 (JP) ................................. 2018-228029

(51) Int. Cl.
*F21S 43/20* (2018.01)
*F21S 43/19* (2018.01)

(52) U.S. Cl.
CPC ............. *F21S 43/26* (2018.01); *F21S 43/195* (2018.01)

(58) Field of Classification Search
None
See application file for complete search history.

(56) References Cited

U.S. PATENT DOCUMENTS

| 2015/0054005 A1 | 2/2015 | Kim et al. |
| 2016/0245470 A1* | 8/2016 | Hatanaka ................ F21S 43/14 |
| 2016/0290587 A1 | 10/2016 | Nakagawa et al. |
| 2017/0343180 A1* | 11/2017 | Ishiyama ............... F21S 41/194 |

FOREIGN PATENT DOCUMENTS

| DE | 102010041114 A1 | 3/2012 |
| DE | 102015206471 A1 | 10/2016 |
| DE | 102016210048 A1 | 12/2017 |
| JP | 20090099715 A | 5/2009 |
| JP | 2011090903 A | 5/2011 |
| JP | 2016-195099 A | 11/2016 |
| WO | WO2013037408 | * 3/2013 |

* cited by examiner

*Primary Examiner* — Ashok Patel
(74) *Attorney, Agent, or Firm* — Banner & Witcoff, Ltd.

(57) ABSTRACT

A vehicular luminaire according to an embodiment includes a socket; a substrate provided on one end part side of the socket; a frame part provided on the substrate; a first light-emitting element provided inside the frame part; a plurality of second light-emitting elements provided inside the frame part and around the first light-emitting element; and an optical element provided at an end part of the frame part opposite to the substrate side. A distance between the substrate and a light-emitting surface of the first light-emitting element differs from a distance between the substrate and light-emitting surfaces of the second light-emitting elements.

20 Claims, 7 Drawing Sheets

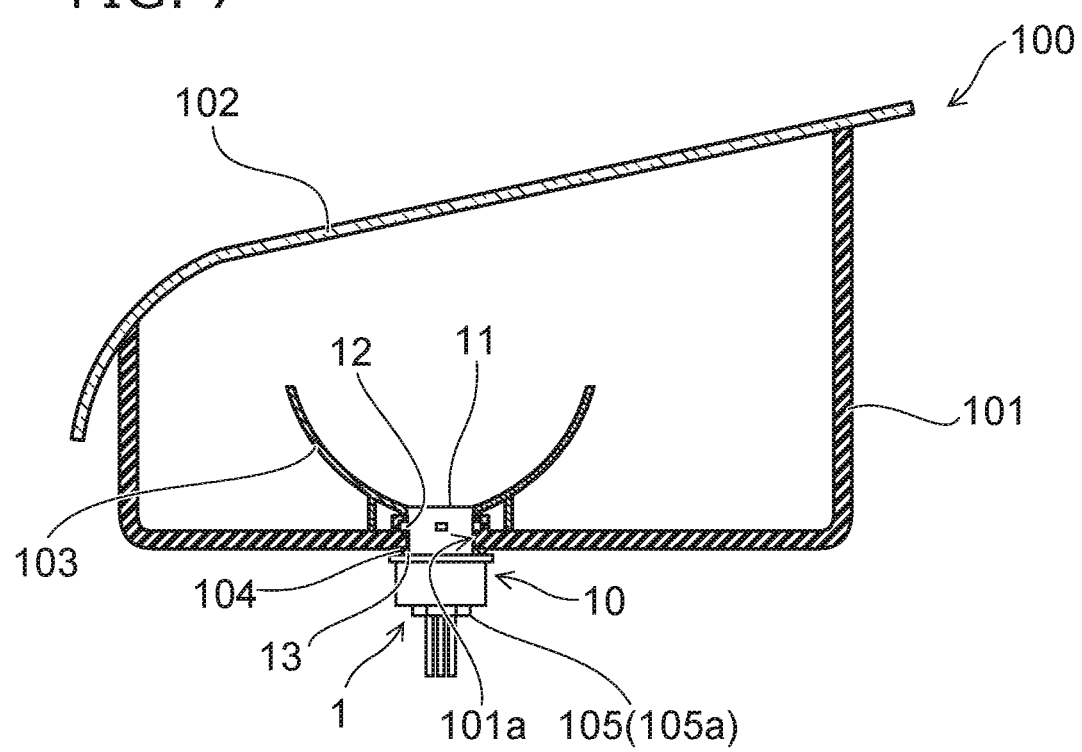

VEHICULAR LUMINAIRE AND VEHICULAR LAMP

CROSS-REFERENCE TO RELATED APPLICATIONS

This application is based upon and claims the benefit of priority from Japanese Patent Application No. 2018-228029, filed on Dec. 5, 2018; the entire contents of which are incorporated herein by reference.

FIELD

Embodiments described herein relate generally to a vehicular luminaire and a vehicular lamp.

BACKGROUND

Known is a vehicular luminaire provided with a plurality of light-emitting diodes (LEDs), a frame part surrounding the plurality of light-emitting diodes, and a sealing part covering the inside of the frame part.

In addition, a vehicular luminaire in which a plurality of vehicular luminaires having different applications are integrated is proposed. For example, a vehicular luminaire provided with stop lamp and tail lamp functions is proposed. In this case, for example, a luminous intensity distribution in which the peripheral edge region of a light-emitting surface is bright at a light-emitting part provided with the plurality of light-emitting diodes is preferable as a stop lamp and a luminous intensity distribution in which the middle region of the light-emitting surface is bright is preferable as a tail lamp.

Accordingly, a technique for controlling the luminous intensity distribution by providing a lens on the light-emitting surface of the sealing part is proposed. Lenses as optical elements, however, are expensive components as it is not easy to design and manufacture the lenses. In addition, preferable luminous intensity distribution may depend on the application of the vehicular luminaire. In this case, a lens change in accordance with the luminous intensity distribution required for the vehicular luminaire may result in a significant increase in vehicular luminaire manufacturing cost.

In this regard, it is desired to develop a technique with which a change in luminous intensity distribution can be facilitated.

DESCRIPTION OF THE DRAWINGS

FIG. 7 is a schematic partial cross-sectional view for illustrating a vehicular lamp.

DETAILED DESCRIPTION

Figure 1:
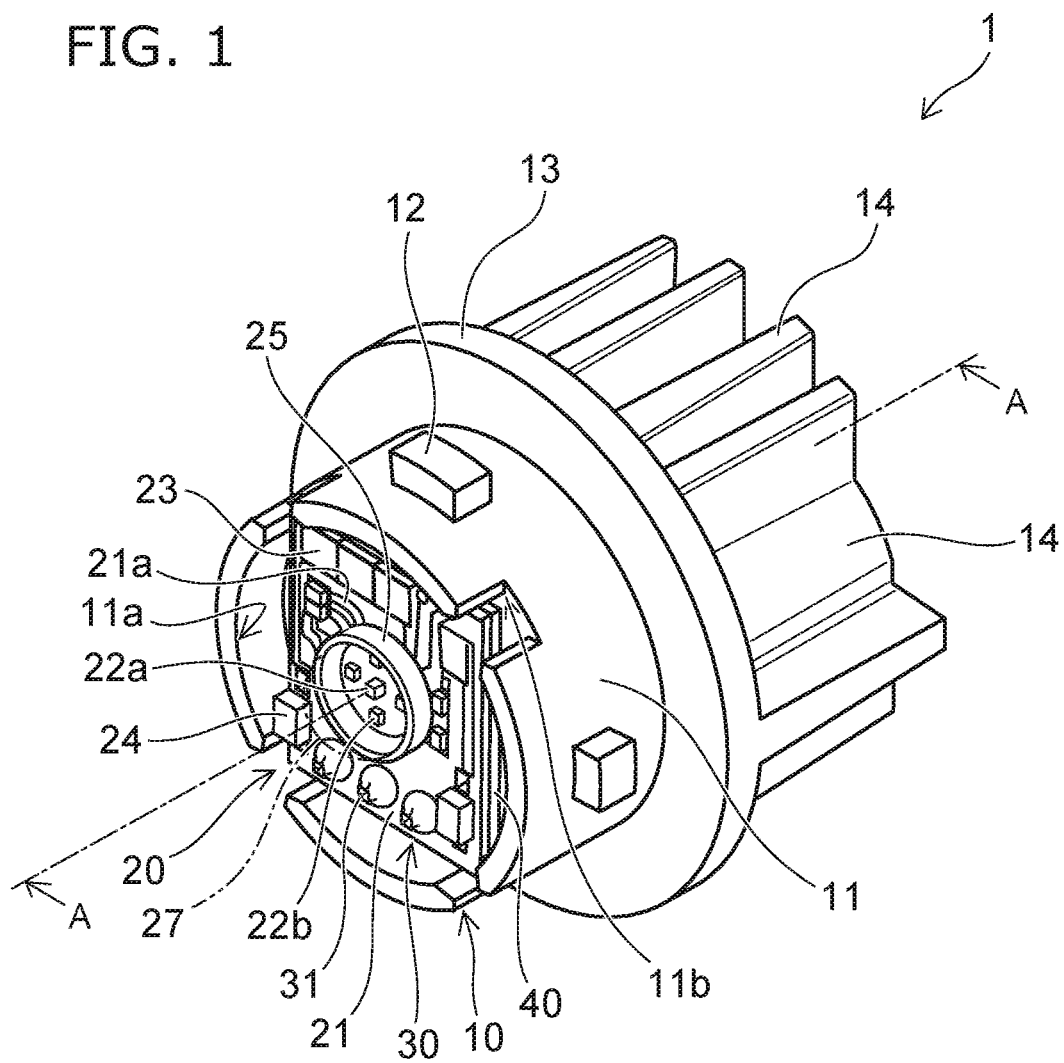
FIG. 1 is a schematic perspective view for illustrating a vehicular luminaire according to the present embodiment.

A vehicular luminaire according to an embodiment includes a socket; a substrate provided on one end part side of the socket; a frame part provided on the substrate; a first light-emitting element provided inside the frame part, a plurality of second light-emitting elements provided inside the frame part and around the first light-emitting element; and an optical element provided at an end part of the frame part opposite to the substrate side. A distance between the substrate and a light-emitting surface of the first light-emitting element differs from a distance between the substrate and light-emitting surfaces of the second light-emitting elements.

Hereinafter, embodiments will be illustrated with reference to drawings. In the drawings, the same components are denoted by the same reference numerals with detailed descriptions appropriately omitted.

(Vehicular Luminaire)

A vehicular luminaire 1 according to the present embodiment can be provided in an automobile, a railway vehicle, and the like. In addition, the vehicular luminaire 1 can be used for multiple applications. For example, the vehicular luminaire 1 may be used as both a stop lamp and a tail lamp or may be used as both a position lamp and a turn signal lamp. In the following description, a case where the vehicular luminaire 1 is used as both a stop lamp and a tail lamp will be illustrated as an example.

FIG. 1 is a schematic perspective view for illustrating the vehicular luminaire 1 according to the present embodiment.

Figure 2:
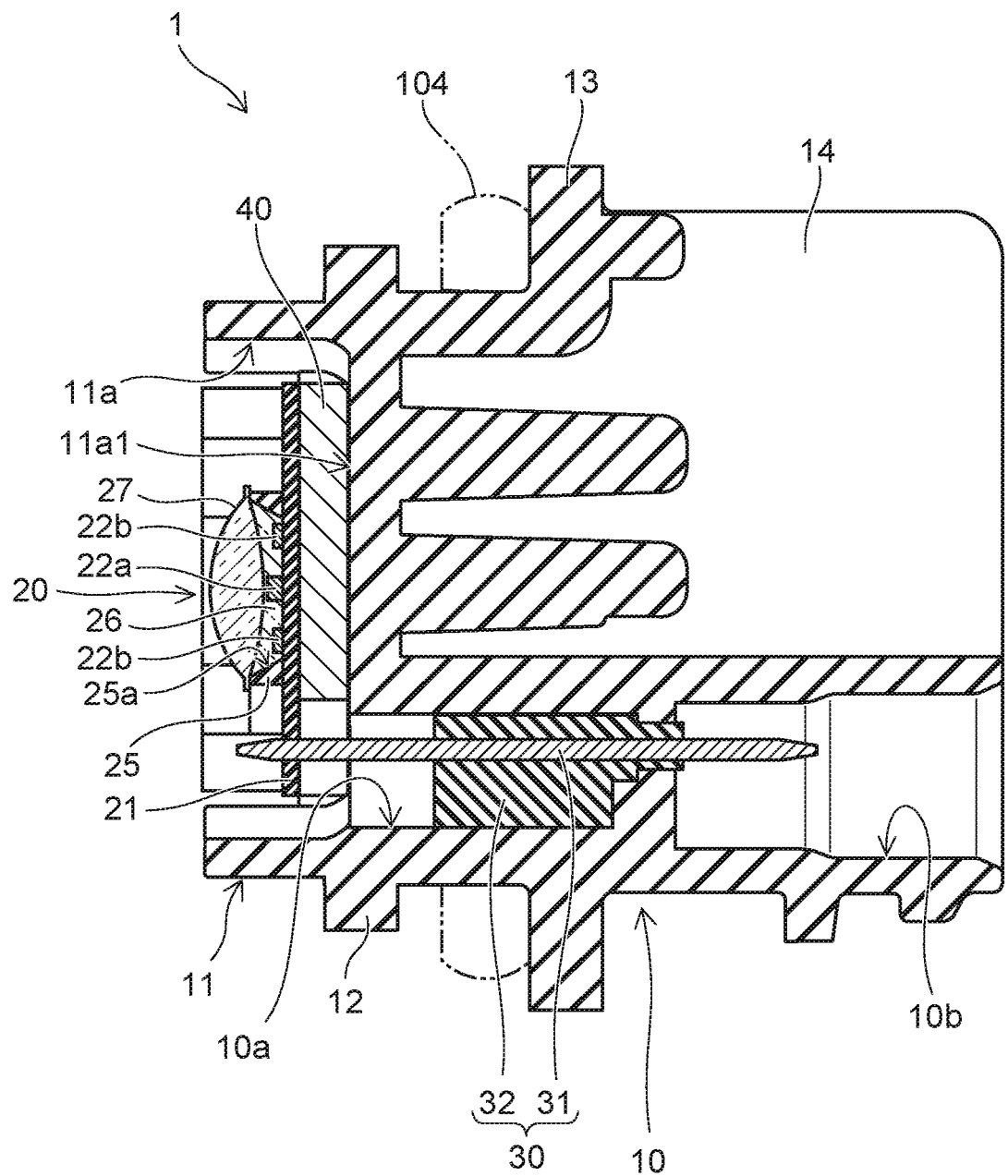
FIG. 2 is a schematic cross-sectional view of the vehicular luminaire in the A-A line direction in FIG. 1.

FIG. 2 is a schematic cross-sectional view of the vehicular luminaire 1 in the A-A line direction in FIG. 1.

As illustrated in FIGS. 1 and 2, a socket 10, a light-emitting module 20, a power-supply unit 30, and a heat conducting unit 40 can be provided in the vehicular luminaire 1.

The socket 10 is capable of having a mounting part 11, a bayonet 12, a flange 13, and a thermal radiation fin 14.

The mounting part 11 can be provided on the surface of the flange 13 opposite to the side on which the thermal radiation fin 14 is provided. The external shape of the mounting part 11 can be columnar. For example, the mounting part 11 has a cylindrical external shape. The mounting part 11 is capable of having a recess 11*a* open to the end face opposite to the flange 13 side. The light-emitting module 20 can be provided via the heat conducting unit 40 on a bottom surface 11*a*1 of the recess 11*a*.

The mounting part 11 can be provided with at least one slit 11*b*. A corner of a substrate 21 can be provided in the slit 11*b*. The dimension (width dimension) of the slit 11*b* in the circumferential direction of the mounting part 11 can be slightly larger than the dimension of the corner of the substrate 21. In this manner, the substrate 21 can be positioned by the corner of the substrate 21 being inserted into the slit 11*b*.

In addition, the planar shape of the substrate 21 can be enlarged by the slit 11*b* being provided. Accordingly, the number of elements mounted on the substrate 21 can be increased. Alternatively, as the outer dimension of the mounting part 11 can be reduced, the mounting part 11 can be reduced in size, and thus the vehicular luminaire 1 can be reduced in size.

The bayonet 12 can be provided on the outside surface of the mounting part 11. For example, the bayonet 12 projects toward the outside of the vehicular luminaire 1. The bayonet 12 is capable of facing the flange 13. A plurality of the bayonets 12 can be provided. The bayonet 12 can be used when the vehicular luminaire 1 is mounted in a housing 101 of a vehicular lamp 100. The bayonet 12 can be used for twist lock.

The flange 13 is capable of having a plate shape. For example, the flange 13 is capable of having a disk shape. The outside surface of the flange 13 can be positioned further outward than the outside surface of the bayonet 12 in the vehicular luminaire 1.

The thermal radiation fin 14 can be provided on the side opposite to the mounting part 11 side of the flange 13. At least one thermal radiation fin 14 can be provided. For example, the socket 10 illustrated in FIGS. 1 and 2 is provided with a plurality of thermal radiation fins. The plurality of thermal radiation fins 14 can be provided side by side in a predetermined direction. The thermal radiation fin 14 is capable of having a plate shape.

The socket 10 can be provided with a hole 10b allowing insertion of a connector 105. The connector 105 having a seal member 105a can be inserted into the hole 10b. Accordingly, the cross-sectional shape of the hole 10b can be adapted to the cross-sectional shape of the connector 105 having the seal member 105a.

The heat generated in the light-emitting module 20 is mainly transferred to the thermal radiation fin 14 via the mounting part 11 and the flange 13. The heat transferred to the thermal radiation fin 14 is mainly released to the outside from the thermal radiation fin 14. Accordingly, the socket 10 is preferably formed of a highly heat-conductive material. For example, the socket 10 can be formed of a metal such as an aluminum alloy.

In recent years, it is desirable that the socket 10 is lightweight and capable of efficiently radiating the heat generated in the light-emitting module 20. Accordingly, it is preferable that the mounting part 11, the bayonet 12, the flange 13, and the thermal radiation fin 14 are formed of a highly heat-conductive resin. The highly heat-conductive resin contains, for example, a filler made of an inorganic material and resin. The highly heat-conductive resin can be, for example, a resin such as polyethylene terephthalate (PET) and nylon mixed with a filler made of carbon, aluminum oxide, or the like.

When the mounting part 11, the bayonet 12, the flange 13, and the thermal radiation fin 14 are integrally molded in the socket 10 containing the highly heat-conductive resin, the heat generated in the light-emitting module 20 can be efficiently radiated. In addition, the weight of the socket 10 can be reduced. The mounting part 11, the bayonet 12, the flange 13, and the thermal radiation fin 14 can be molded integrally with the power-supply unit 30 by an insert molding method or the like.

The power-supply unit 30 is capable of having a power-supply terminal 31 and an insulation part 32.

The power-supply terminal 31 can be a rod-shaped body. The power-supply terminal 31 is capable of projecting from the bottom surface 11a1 of the recess 11a. A plurality of the power-supply terminals 31 can be provided. The plurality of power-supply terminals 31 can be provided side by side in a predetermined direction. The plurality of power-supply terminals 31 can be provided in the insulation part 32. The insulation part 32 can be provided between the power-supply terminal 31 and the socket 10. The plurality of power-supply terminals 31 are capable of extending in the insulation part 32 and projecting from the end face of the insulation part 32 on the light-emitting module 20 side and the end face of the insulation part 32 on the thermal radiation fin 14 side. The end parts of the plurality of power-supply terminals 31 on the light-emitting module 20 side can be electrically and mechanically connected to a wiring pattern 21a provided on the substrate 21. For example, one end part of the power-supply terminal 31 can be soldered to the wiring pattern 21a. The end parts of the plurality of power-supply terminals 31 on the thermal radiation fin 14 side can be exposed inside the hole 10b. The connector 105 can be fitted to the plurality of power-supply terminals 31 exposed inside the hole 10b. The power-supply terminal 31 is capable of having conductivity. The power-supply terminal 31 can be formed of a metal such as a copper alloy. The power-supply terminal 31 is not limited to the illustration and can be appropriately changed in number, shape, disposition, material, and the like.

As described above, the socket 10 is preferably formed of a highly heat-conductive material. The highly heat-conductive material has conductivity in some cases. For example, a metal such as an aluminum alloy, a highly heat-conductive resin containing a filler made of carbon, and the like have conductivity. Accordingly, the insulation part 32 can be provided for insulation between the power-supply terminal 31 and the socket 10 having conductivity. In addition, the insulation part 32 is capable of having a function of holding the plurality of power-supply terminals 31. The insulation part 32 can be omitted when the socket 10 is formed of a highly heat-conductive resin having insulating properties (such as a highly heat-conductive resin containing a filler made of aluminum oxide). In this case, the socket 10 is capable of holding the plurality of power-supply terminals 31.

The insulation part 32 is capable of having insulating properties. The insulation part 32 can be formed of a resin having insulating properties. Here, in the case of the vehicular luminaire 1 provided in an automobile, the temperature in a use environment is −40° C. to 85° C. Accordingly, it is preferable that the thermal expansion coefficient of the material of the insulation part 32 is as close as possible to the thermal expansion coefficient of the material of the socket 10. In this manner, the thermal stress generated between the insulation part 32 and the socket 10 can be reduced. For example, the material of the insulation part 32 can be the highly heat-conductive resin contained in the socket 10 or the resin contained in the highly heat-conductive resin.

The insulation part 32 can be, for example, press-fitted into a hole 10a provided in the socket 10 or bonded to the inner surface of the hole 10a. In addition, the socket 10 and the power-supply unit 30 can be integrally molded by an insert molding method.

The heat conducting unit 40 can be provided between the substrate 21 and the bottom surface 11a1 of the recess 11a. The heat conducting unit 40 can be provided on the bottom surface 11a1 of the recess 11a via a bonding part. In other words, the heat conducting unit 40 can be bonded to the bottom surface 11a1 of the recess 11a. It is preferable that a highly heat-conductive adhesive is used for the bonding between the heat conducting unit 40 and the bottom surface 11a1 of the recess 11a. For example, the adhesive can be an adhesive mixed with a filler using an inorganic material. The inorganic material is preferably a highly heat-conductive material (for example, ceramics such as aluminum oxide and aluminum nitride). The heat conductivity of the adhesive can be, for example, 0.5 W/(m·K) or more and 10 W/(m·K) or less.

In addition, the heat conducting unit 40 can be embedded in the bottom surface 11a1 of the recess 11a by an insert molding method. In addition, the heat conducting unit 40 can be attached to the bottom surface 11a1 of the recess 11a via a layer made of heat-conductive grease (thermal radiation grease). Although the type of the heat-conductive grease is not particularly limited, the heat-conductive grease can be, for example, a mixture of modified silicone and a filler using a highly heat-conductive material (for example, ceramics such as aluminum oxide and aluminum nitride). The heat conductivity of the heat-conductive grease can be, for example, 1 W/(m·K) or more and 5 W/(m·K) or less.

The heat conducting unit 40 is provided so that, for example, the heat generated in the light-emitting module 20 is easily transferred to the socket 10. Accordingly, the heat conducting unit 40 is preferably formed of a highly heat-conductive material. The heat conducting unit 40 has a plate shape and can be formed of a metal such as aluminum, an aluminum alloy, copper, and a copper alloy.

The light-emitting module 20 is capable of having the substrate 21, a light-emitting element 22a (corresponding to an example of a first light-emitting element), a light-emitting element 22b (corresponding to an example of a second light-emitting element), a resistor 23, a control element 24, a frame part 25, a sealing part 26, and an optical element 27.

The substrate 21 is provided on one end part side of the socket 10. The substrate 21 can be provided on the heat conducting unit 40 via a bonding part. In other words, the substrate 21 can be bonded to the heat conducting unit 40. The adhesive can be, for example, the same as the adhesive for the bonding between the heat conducting unit 40 and the bottom surface 11a1 of the recess 11a.

The substrate 21 is capable of having a plate shape. The planar shape of the substrate 21 can be, for example, quadrangular. The material and the structure of the substrate 21 are not particularly limited. For example, the substrate 21 can be formed of an inorganic material such as ceramics (aluminum oxide, aluminum nitride, or the like), an organic material such as paper phenol and glass epoxy, or the like. In addition, the substrate 21 may be the surface of a metal plate coated with an insulating material. When the surface of a metal plate is coated with an insulating material, the insulating material may be made of an organic material or an inorganic material. When the light-emitting elements 22a and 22b generate a large amount of heat, it is preferable from the viewpoint of thermal radiation to form the substrate 21 by using a highly heat-conductive material. Examples of the highly heat-conductive material include ceramics such as aluminum oxide and aluminum nitride, a highly heat-conductive resin, and the surface of a metal plate coated with an insulating material. In addition, the substrate 21 may have a single-layer structure or a multilayer structure.

The wiring pattern 21a can be provided on the surface of the substrate 21. The wiring pattern 21a can be formed of, for example, a material containing silver as a main component, a material containing copper as a main component, or the like. In this case, a wiring pattern of the tail lamp and a wiring pattern of the stop lamp can be provided.

The light-emitting elements 22a and 22b can be provided on the side of the substrate 21 opposite to the bottom surface 11a1 side of the recess 11a. The light-emitting elements 22a and 22b can be provided on the substrate 21. The light-emitting elements 22a and 22b can be provided inside the frame part 25. The light-emitting elements 22a and 22b can be electrically connected to the wiring pattern 21a provided on the surface of the substrate 21. For example, the light-emitting element 22a can be electrically connected to the wiring pattern of the tail lamp. A plurality of the light-emitting elements 22b can be electrically connected to the wiring pattern of the stop lamp.

In this case, in plan view (when the vehicular luminaire 1 is viewed from the direction along the central axis), one light-emitting element 22a can be provided in the middle region of the frame part 25 and used as the light-emitting element 22a for the tail lamp. In addition, the plurality of light-emitting elements 22b can be provided around the light-emitting element 22a and used as the light-emitting elements 22b for the stop lamp. In the vehicular luminaire 1 according to the present embodiment, four light-emitting elements 22b are provided equidistantly from each other about the center of the light-emitting element 22a. In this case, the light-emitting element 22b can be provided at each of the four end parts of the cross about the center of the light-emitting element 22a. In addition, the light-emitting element 22b can be provided at each of the four corners of the square about the center of the light-emitting element 22a. Modification examples of the number and the disposition of the light-emitting elements 22b will be described later (see FIGS. 6A to 6C).

The plurality of light-emitting elements 22b can be electrically connected in series. In addition, the light-emitting elements 22a and 22b can be electrically connected in series to the resistor 23. Although the number of the light-emitting elements 22b is not limited to four, Lambert luminous intensity distribution is easily obtained by the four light-emitting elements 22b being provided.

The light-emitting elements 22a and 22b can be light-emitting diodes, organic light-emitting diodes, laser diodes, and the like.

The light-emitting elements 22a and 22b can be chip-shaped light-emitting elements. The chip-shaped light-emitting elements 22a and 22b can be mounted by chip on board (COB). In this manner, the light-emitting elements 22a and 22b can be provided in quantity in a narrow region. Accordingly, the light-emitting module 20 can be reduced in size, and thus the vehicular luminaire 1 can be reduced in size.

The chip-shaped light-emitting elements 22a and 22b can be any of flip chip-type light-emitting elements, upper electrode-type light-emitting elements, and upper and lower electrode-type light-emitting elements.

The upper electrode-type light-emitting element or the upper and lower electrode-type light-emitting element can be electrically connected to the wiring pattern 21a by, for example, a wire bonding method. In this case, it is preferable that the connection part between the wiring and the wiring pattern 21a is a first bonding part and the connection part between the wiring and the electrodes of the light-emitting elements 22a and 22b is a second bonding part. In other words, it is preferable that the connection part between the wiring for wire bonding and the electrodes of the light-emitting elements 22a and 22b is a second bonding part. It is preferable that the connection part between the wiring for wire bonding and the wiring pattern 21a of the substrate 21 is a first bonding part. In this manner, the height of the formed wiring (loop height) can be reduced, and thus interference between the optical element 27 and the wiring can be suppressed.

In the case of the flip chip-type light-emitting elements 22a and 22b, there is no wiring for connection between the light-emitting elements 22a and 22b and the wiring pattern 21a, and thus the distance between the optical element 27 and the light-emitting elements 22a and 22b can be shortened.

The resistor 23 can be provided on the side of the substrate 21 opposite to the bottom surface 11a1 side of the recess 11a. The resistor 23 can be provided on the substrate 21. The resistor 23 can be electrically connected to the wiring pattern 21a provided on the surface of the substrate 21. The resistor 23 can be, for example, a surface mounting-type resistor, a resistor having a lead wire (metal oxide film resistor), or a film resistor formed by a screen printing method or the like. The resistor 23 illustrated in FIG. 1 is a film resistor.

The material of the film resistor can be, for example, ruthenium oxide ($RuO_2$). The film resistor can be formed by, for example, a screen printing method and a firing method. When the resistor 23 is a film resistor, the area of contact between the resistor 23 and the substrate 21 can be increased, and thus thermal radiation can be improved. In addition, a plurality of the resistors 23 can be formed at one time. Accordingly, productivity can be improved. In addition, it is possible to suppress resistance value variations in the plurality of resistors 23.

Here, the forward voltage characteristics of the light-emitting elements 22a and 22b vary. Accordingly, the brightness of the light emitted from the light-emitting elements 22a and 22b (luminous flux, luminance, luminous intensity, and illuminance) vary when the applied voltage between the anode terminal and the ground terminal is constant. Accordingly, the value of the current flowing through the light-emitting elements 22a and 22b can be kept within a predetermined range by the resistor 23 such that the brightness of the light emitted from the light-emitting elements 22a and 22b falls within a predetermined range. In this case, the value of the current flowing through the light-emitting elements 22a and 22b can be kept within a predetermined range by the resistance value of the resistor 23 being changed.

When the resistor 23 is a surface mounting-type resistor, a resistor having a lead wire, or the like, it is possible to select the resistor 23 having an appropriate resistance value in accordance with the forward voltage characteristics of the light-emitting elements 22a and 22b. When the resistor 23 is a film resistor, the resistance value can be increased by a part of the resistor 23 being removed. For example, a part of the resistor 23 can be easily removed by the resistor 23 being irradiated with laser light. The number, the size, the disposition, and the like of the resistors 23 are not limited to the illustration and can be appropriately changed in accordance with, for example, the number and the specifications of the light-emitting elements 22a and 22b.

The control element 24 can be provided on the side of the substrate 21 opposite to the bottom surface 11a1 side of the recess 11a. The control element 24 can be provided on the substrate 21. The control element 24 can be electrically connected to the wiring pattern 21a provided on the surface of the substrate 21. The control element 24 can be provide so that no reverse voltage is applied to the light-emitting elements 22a and 22b and no pulse noise from the reverse direction is applied to the light-emitting elements 22a and 22b. The control element 24 can be a diode or the like. The control element 24 can be a surface mounting-type diode, a diode having a lead wire, or the like. The control element 24 illustrated in FIG. 1 is a surface mounting-type diode.

In addition, it is possible to provide a pull-down resistor in order to, for example, detect disconnection of the light-emitting elements 22a and 22b and prevent erroneous lighting. In addition, a coating part covering the wiring pattern 21a, the film resistor, and the like can be provided. The coating part is capable of containing a glass material or the like.

The frame part 25 can be provided on the side of the substrate 21 opposite to the bottom surface 11a1 side of the recess 11a. The frame part 25 can be bonded onto the substrate 21. The frame part 25 is capable of having a frame shape. The light-emitting elements 22a and 22b can be provided in the region surrounded by the frame part 25. For example, the frame part 25 is capable of surrounding the light-emitting elements 22a and 22b. The frame part 25 can be formed of resin. The resin can be a thermoplastic resin such as polybutylene terephthalate (PBT), polycarbonate (PC), PET, nylon, polypropylene (PP), polyethylene (PE), and polystyrene (PS).

In addition, it is possible to improve the reflectance to the light emitted from the light-emitting elements 22a and 22b by mixing the resin with particles of titanium oxide or the like. Any particles made of a material having a high reflectance to the light emitted from the light-emitting elements 22a and 22b may be mixed without being limited to the particles of titanium oxide. In addition, the frame part 25 can be formed of a white resin or the like.

At least a part of an inner surface 25a of the frame part 25 can be an inclined surface inclined in a direction away from the central axis of the frame part 25 as the inclined surface is separated from the substrate 21. The inner surface 25a of the frame part 25 can also be a surface substantially perpendicular to the surface of the substrate 21. At least a part of the inner surface 25a of the frame part 25 can be a curved surface projecting inward. When the inner surface 25a of the frame part 25 is an inclined surface, the light incident on the inner surface is easily emitted toward the front side of the vehicular luminaire 1. The frame part 25 is capable of having a reflector function and a function of defining the range of formation of the sealing part 26.

The sealing part 26 can be provided in the region surrounded by the frame part 25. The sealing part 26 can be provided so as to cover the region surrounded by the frame part 25. In other words, the sealing part 26 can be provided so as to cover the light-emitting elements 22a and 22b. The sealing part 26 can be formed of a translucent material. The sealing part 26 can be formed by, for example, the region surrounded by the frame part 25 being filled with resin. The resin filling can be performed by means of a liquid dispensing device such as a dispenser. The resin used for the filling can be silicone resin or the like. In addition, the sealing part 26 is capable of containing a phosphor. The phosphor can be, for example, a yttrium-aluminum-garnet-based phosphor (YAG-based phosphor). The type of the phosphor can be appropriately changed such that a predetermined luminescent color can be obtained in accordance with the application of the vehicular luminaire 1 or the like.

The optical element 27 diffuses the light emitted from the light-emitting elements 22a and 22b such that predetermined luminous intensity distribution characteristics can be obtained. The optical element 27 can be a convex lens or the like. The optical element 27 may be a concave lens or the like. Here, a case where the optical element 27 is a convex lens will be described as an example.

The optical element 27 can be formed of a translucent material. The optical element 27 can be formed of a translucent resin such as silicone resin and acrylic resin, glass, or the like. The optical element 27 can be formed by an injection molding method, a molding method, or the like.

Figure 3A:
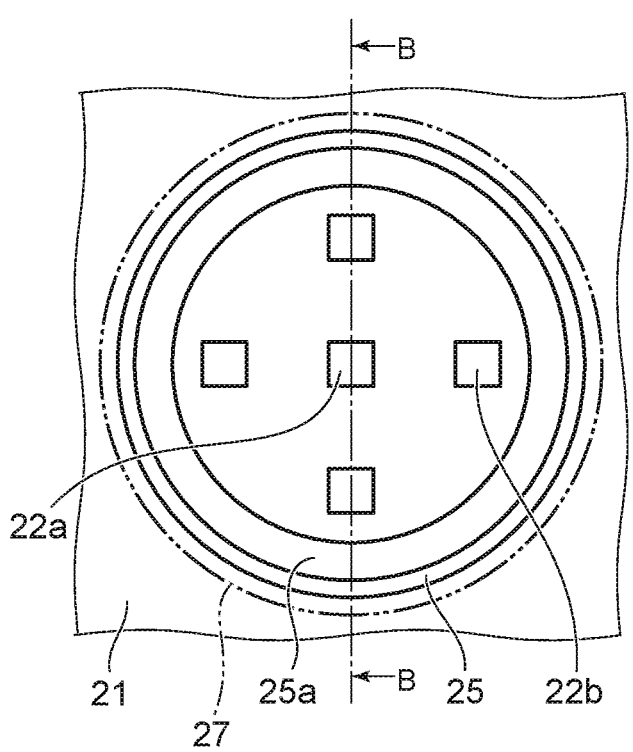
FIG. 3A is a schematic plan view for illustrating light-emitting elements and an optical element.

FIG. 3A is a schematic plan view for illustrating the light-emitting elements 22a and 22b and the optical element 27.

Figure 3B:
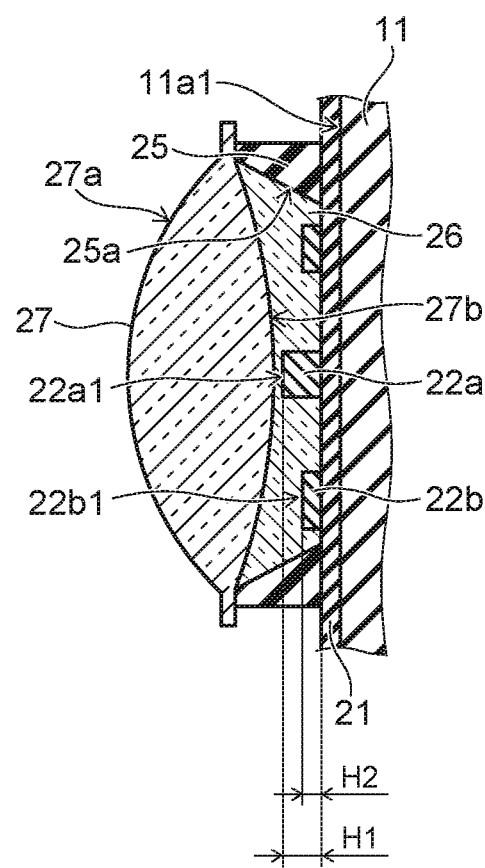
FIG. 3B is a schematic cross-sectional view of the light-emitting elements and the optical element in the B-B line direction in FIG. 3A.

FIG. 3B is a schematic cross-sectional view of the light-emitting elements 22a and 22b and the optical element 27 in the B-B line direction in FIG. 3A.

As illustrated in FIGS. 3A and 3B, the optical element 27 is provided at the end part of the frame part 25 opposite to the substrate 21 side. The vicinity of the peripheral edge of the optical element 27 can be provided outside the frame part 25. The optical element 27 can be bonded to at least one of the end face of the sealing part 26 opposite to the substrate 21 side and the end face of the frame part 25 opposite to the substrate 21 side.

The optical element 27 as a convex lens has a surface (light-emitting surface) 27a on the side opposite to the substrate 21 side. The surface 27a can be a curved surface projecting toward the side opposite to the substrate 21 side. The surface 27a can be, for example, a part of a spherical surface. The optical element 27 has a surface (light incident surface) 27b on the substrate 21 side. The surface 27b can be a curved surface projecting toward the substrate 21 side. The surface 27b can be, for example, a part of a spherical surface. The surface 27b can be an inclined surface inclined in a direction toward the surface 27a as the inclined surface heads toward the peripheral edge. The center of the surface 27a of the optical element 27, the center of the surface 27b, and the center of the light-emitting element 22a can be provided on a straight line.

As described above, the sealing part 26 can be formed by the region surrounded by the frame part 25 being filled with resin. The optical element 27 can be provided so as to be pressed onto the sealing part 26 that is yet to be cured. In this case, there is a possibility that no intended luminous intensity distribution can be obtained once an air gap is generated between the sealing part 26 and the surface 27b of the optical element 27. Accordingly, the surface 27b of the optical element 27 is preferably in close contact with the sealing part 26.

For example, when the region surrounded by the frame part 25 is filled with a large amount of the material to be the sealing part 26 and the optical element 27 is pressed against the material with which the region is filled, a part of the material is capable of flowing to the outside of the frame part 25. In this manner, the surface 27b of the optical element 27 can be brought into close contact with the sealing part 26. Air may be caught when the optical element 27 is pressed against the material with which the region is filled. An air gap is generated when the caught air remains without being discharged.

The surface 27b of the optical element 27 is an inclined surface inclined in a direction toward the surface 27a as the inclined surface heads toward the peripheral edge, and thus the material with which the region is filled is easily pushed to the outside of the frame part 25. In addition, the air caught between the optical element 27 and the material is easily discharged. In addition, it is possible to suppress an excessive pressure acting on the light-emitting elements 22a and 22b and the wiring.

Such an effect can be obtained even when the surface 27b is not a part of a spherical surface. For example, the surface 27b may be a surface constituting a cone, a truncated cone, a pyramid, a truncated pyramid, or the like. In addition, the surface 27b can be a flat surface substantially parallel to the substrate 21 depending on, for example, the viscosity of the material to be the sealing part 26.

The optical element 27 can be easily given the function of a convex lens when the surface 27b is a part of a spherical surface.

As illustrated in FIG. 3B, a distance H1 between the substrate 21 and a light-emitting surface 22a1 of the light-emitting element 22a can be greater than a distance H2 between the substrate 21 and a light-emitting surface 22b1 of the light-emitting element 22b. In this case, the thickness of the light-emitting element 22a can be greater than the thickness of the light-emitting element 22b. The thickness of the mounting pad to which the light-emitting element 22a is connected can be increased or a spacer or the like can be provided between the light-emitting element 22a and the substrate 21.

Figure 4A:
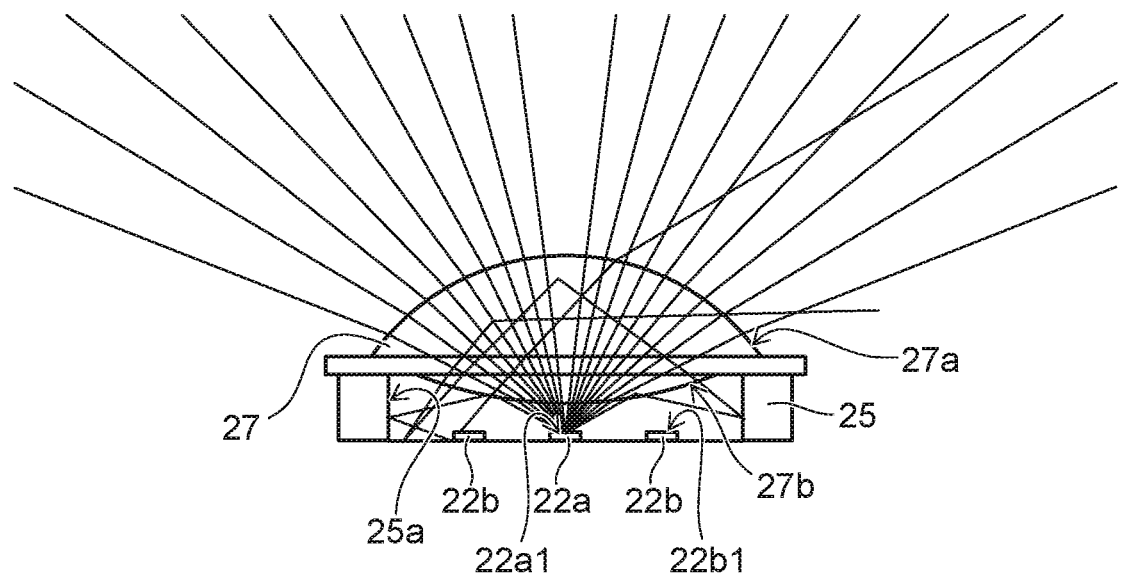
FIGS. 4A and 4B are schematic diagrams for illustrating the relationship between the position of the light-emitting surface of the light-emitting element and luminous intensity distribution.
Figure 4B:
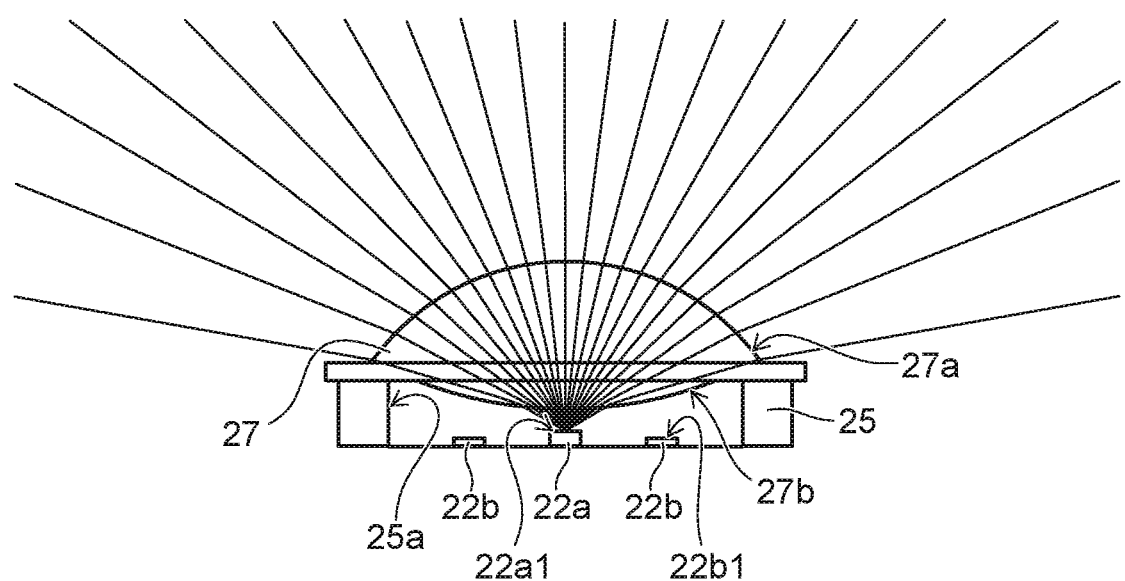

FIGS. 4A and 4B are schematic diagrams for illustrating the relationship between the position of the light-emitting surface 22a1 of the light-emitting element 22a and luminous intensity distribution. Illustrated in FIGS. 4A and 4B is a case where the inner surface 25a of the frame part 25 is a surface substantially perpendicular to the surface of the substrate 21.

Illustrated in FIG. 4A is a case where the distance H1 between the substrate 21 and the light-emitting surface 22a1 of the light-emitting element 22a is substantially the same as the distance H2 between the substrate 21 and the light-emitting surface 22b1 of the light-emitting element 22b. For example, illustrated in FIG. 4A is a case where the thickness of the light-emitting element 22a is substantially the same as the thickness of the light-emitting element 22b.

Illustrated in FIG. 4B is a case where the distance H1 between the substrate 21 and the light-emitting surface 22a1 of the light-emitting element 22a exceeds the distance H2 between the substrate 21 and the light-emitting surface 22b1 of the light-emitting element 22b (case illustrated in FIG. 3B). For example, illustrated in FIG. 4B is a case where the thickness of the light-emitting element 22a exceeds the thickness of the light-emitting element 22b.

As can be seen from FIG. 4A, when the distance H1 and the distance H2 are substantially the same, it is possible to reduce the light emitted to the side of the light-emitting module 20 (vehicular luminaire 1) as compared with the case of FIG. 4B. In other words, the luminous intensity distribution angle can be reduced. This means that the light emitted to the side of the light-emitting module 20 (vehicular luminaire 1) can be further reduced when the distance H1 becomes smaller than the distance H2. For example, it is possible to reduce the light emitted to the side of the light-emitting module 20 (vehicular luminaire 1) by causing the light-emitting element 22a to become smaller in thickness than the light-emitting element 22b.

As can be seen from FIG. 4B, when the distance H1 exceeds the distance H2, it is possible to increase the light emitted to the side of the light-emitting module 20 (vehicular luminaire 1) as compared with the case of FIG. 4A. In other words, the luminous intensity distribution angle can be increased. Furthermore, the light reflected by the surface 27b of the optical element 27 can be reduced. In other words, the light extracting efficiency is improved, and thus the luminous flux can be increased.

Figure 5A:
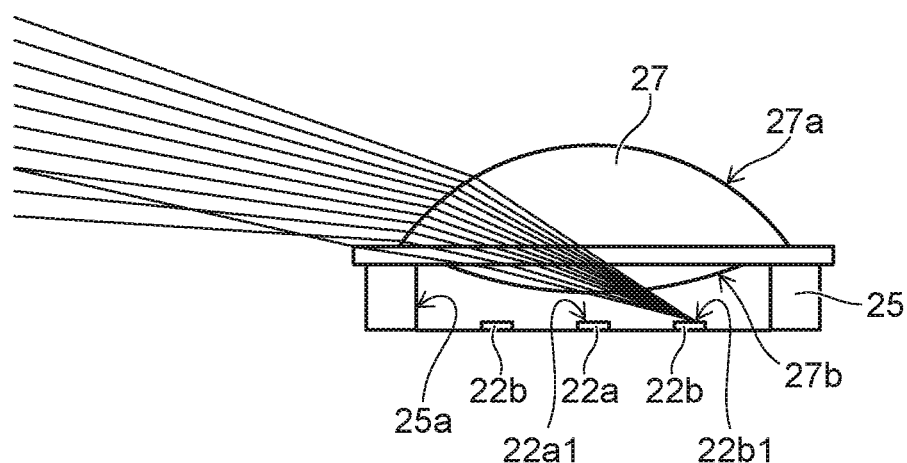
FIGS. 5A and 5B are schematic diagrams for illustrating the relationship between the position of the light-emitting surface of the light-emitting element and luminous intensity distribution.
Figure 5B:
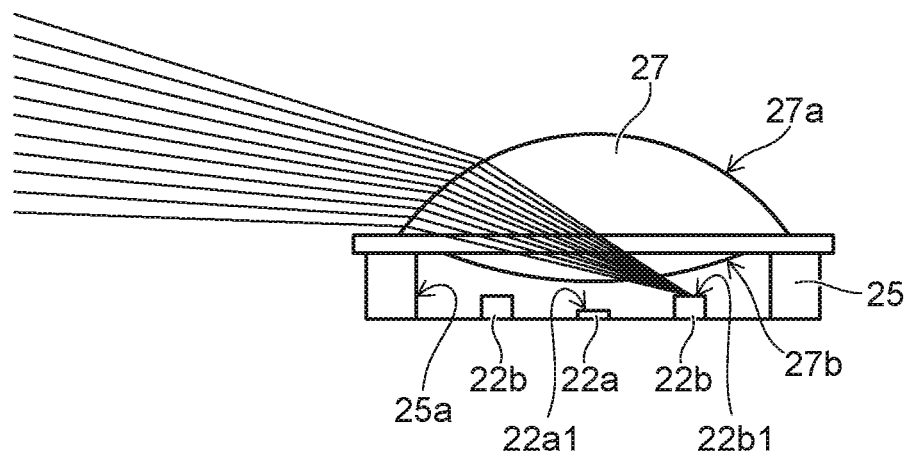

FIGS. 5A and 5B are schematic diagrams for illustrating the relationship between the position of the light-emitting surface 22b1 of the light-emitting element 22b and luminous intensity distribution. Illustrated in FIGS. 5A and 5B is a case where the inner surface 25a of the frame part 25 is a surface substantially perpendicular to the surface of the substrate 21.

Illustrated in FIG. 5A is a case where the distance H1 between the substrate 21 and the light-emitting surface 22a1 of the light-emitting element 22a is substantially the same as the distance H2 between the substrate 21 and the light-emitting surface 22b1 of the light-emitting element 22b. For example, illustrated in FIG. 5A is a case where the thickness of the light-emitting element 22a is substantially the same as the thickness of the light-emitting element 22b.

Illustrated in FIG. 5B is a case where the distance H2 between the substrate 21 and the light-emitting surface 22b1 of the light-emitting element 22b exceeds the distance H1 between the substrate 21 and the light-emitting surface 22a1 of the light-emitting element 22a. For example, illustrated in FIG. 5B is a case where the thickness of the light-emitting element 22b exceeds the thickness of the light-emitting element 22a.

As can be seen from FIG. 5A, when the distance H1 and the distance H2 are substantially the same, it is possible to reduce the light emitted to the side of the light-emitting module 20 (vehicular luminaire 1) as compared with the case of FIG. 5B. In other words, the luminous intensity distribution angle can be reduced. This means that the light emitted to the side of the light-emitting module 20 (vehicular luminaire 1) can be further reduced when the distance H2 becomes smaller than the distance H1. For example, it is possible to reduce the light emitted to the side of the light-emitting module 20 (vehicular luminaire 1) by causing the light-emitting element 22b to become smaller in thickness than the light-emitting element 22a.

As can be seen from FIG. 5B, when the distance H2 exceeds the distance H1, it is possible to increase the light emitted to the side of the light-emitting module 20 (vehicular luminaire 1) as compared with the case of FIG. 5A. In other words, the luminous intensity distribution angle can be increased. Furthermore, the light reflected by the surface 27b of the optical element 27 can be reduced. In other words, the light extracting efficiency is improved, and thus the luminous flux can be increased.

Here, the preferable luminous intensity distribution may depend on the application of the vehicular luminaire 1. For example, when the vehicular luminaire 1 is a stop lamp, a luminous intensity distribution in which the peripheral edge region of the light-emitting surface of the light-emitting module 20 is bright is preferable. When the vehicular luminaire 1 is a tail lamp, a luminous intensity distribution in which the middle region of the light-emitting surface of the light-emitting module 20 is bright is preferable.

In addition, a plurality of vehicular luminaires having different applications may be integrated in the vehicular luminaire. For example, the vehicular luminaire 1 described above can be a vehicular luminaire provided with stop lamp and tail lamp functions. In this case, the light-emitting element 22a can be used as a light-emitting element for a tail lamp. The light-emitting element 22b can be used as a light-emitting element for a stop lamp.

As described above, the preferable luminous intensity distribution in the case of a stop lamp and the preferable luminous intensity distribution in the case of a tail lamp differ from each other. Accordingly, in general, a luminous intensity distribution suitable for each application is obtained by means of a lens. Lenses, however, are expensive components as it is not easy to design and manufacture the lenses. In addition, lenses are dedicated components, and thus it may be necessary to change the lenses once the light-emitting element is changed in number, disposition, or the like. Accordingly, an increase in manufacturing cost, an increase in stock parts, and an increase in the complexity of inventory management are arisen.

In the vehicular luminaire 1 according to the present embodiment, it is possible to obtain a desired luminous intensity distribution by changing each of the position of the light-emitting surface 22a1 of the light-emitting element 22a and the position of the light-emitting surface 22b1 of the light-emitting element 22b. For example, the distance H1 between the substrate 21 and the light-emitting surface 22a1 of the light-emitting element 22a can be different from the distance H2 between the substrate 21 and the light-emitting surface 22b1 of the light-emitting element 22b.

Accordingly, with the vehicular luminaire 1 according to the present embodiment, luminous intensity distribution can be changed with ease. In addition, it is possible to reduce the types of the required optical element 27 in accordance with the luminous intensity distribution.

Figure 6A:
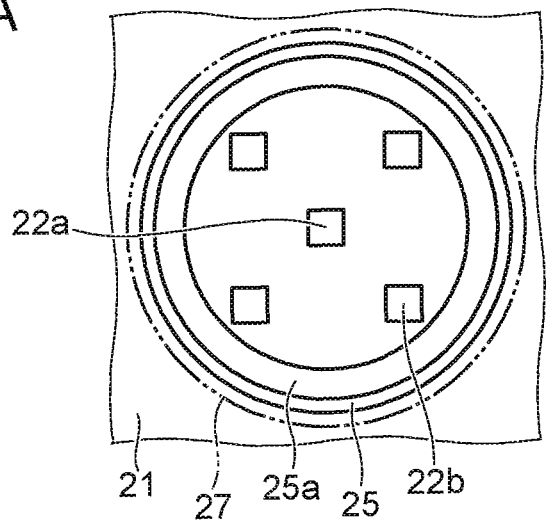
FIGS. 6A to 6C are schematic plan views for illustrating the disposition of the light-emitting element according to another embodiment.
Figure 6B:
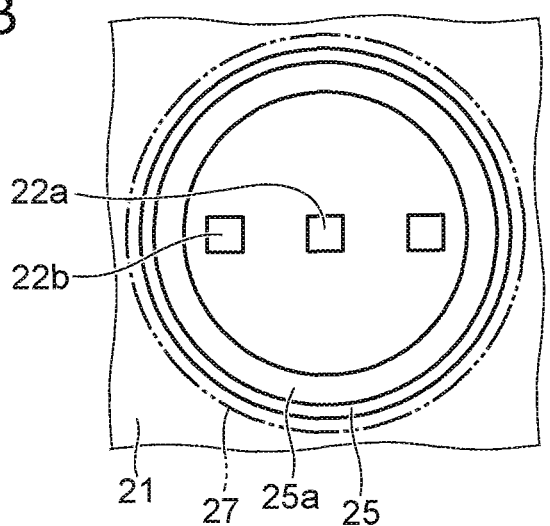
Figure 6C:
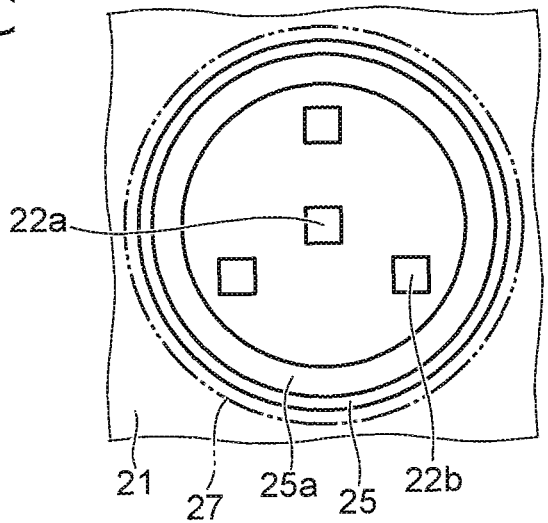

FIGS. 6A to 6C are schematic plan views for illustrating the disposition of the light-emitting element 22b according to another embodiment.

In the case illustrated in FIG. 3A, the light-emitting element 22b is provided at each of the four end parts of the cross about the center of the light-emitting element 22a.

In the case illustrated in FIG. 6A, in contrast, the light-emitting element 22b is provided at each of the four corners of the square about the center of the light-emitting element 22a. In the case illustrated in FIG. 6B, two light-emitting elements 22b are provided at positions in line symmetry with respect to a straight line passing through the center of the light-emitting element 22a as an axis of symmetry. In the case illustrated in FIG. 6C, the light-emitting element 22b is provided at each of the three corners of the equilateral triangle the center of gravity of which is the center of the light-emitting element 22a.

In other words, when the vehicular luminaire 1 is viewed from the direction along the central axis, one light-emitting element 22a can be provided in the middle region of the frame part 25. The plurality of light-emitting elements 22b can be provided at positions in rotational symmetry about the center of one light-emitting element 22a.

Even when the light-emitting elements 22b are as described above in number and disposition, it is possible to obtain a desired luminous intensity distribution by changing each of the position of the light-emitting surface 22a1 of the light-emitting element 22a and the position of the light-emitting surface 22b1 of the light-emitting element 22b.

Although the surface 27b of the optical element 27 described above is a slope, the surface 27b may be a flat surface substantially parallel to the substrate 21. Even when the surface 27b is a flat surface, it is possible to obtain a desired luminous intensity distribution by changing each of the position of the light-emitting surface 22a1 of the light-emitting element 22a and the position of the light-emitting surface 22b1 of the light-emitting element 22b. When the surface 27b is a slope, it is easy to push the material to be the sealing part 26 to the outside of the frame part 25. In addition, the air caught between the optical element 27 and the material is easily discharged. In addition, it is possible to suppress an excessive pressure acting on the light-emitting elements 22a and 22b and the wiring.

(Vehicular Lamp)

Next, the vehicular lamp 100 will be illustrated.

In the following description, a case where the vehicular lamp 100 is a rear combination light provided in an automobile will be described as an example. However, the vehicular lamp 100 is not limited to rear combination lights provided in automobiles. The vehicular lamp 100 may be a vehicular lamp provided in an automobile, a railway vehicle, or the like.

FIG. 7 is a schematic partial cross-sectional view for illustrating the vehicular lamp 100.

As illustrated in FIG. 7, the vehicular lamp 100 can be provided with the vehicular luminaire 1, the housing 101, a cover 102, an optical element 103, a seal member 104, and the connector 105.

The vehicular luminaire 1 can be attached to the housing 101. The housing 101 is capable of holding the mounting part 11. The housing 101 is capable of having a box shape having one open end part side. The housing 101 can be formed of, for example, a resin that does not transmit light. The bottom surface of the housing 101 can be provided with an attachment hole 101a into which the part of the mounting part 11 where the bayonet 12 is provided is inserted. A recess into which the bayonet 12 provided at the mounting part 11 is inserted can be provided at the peripheral edge of the attachment hole 101a. Although a case where the attachment hole 101a is directly provided in the housing 101 is illustrated, an attachment member having the attachment hole 101a may be provided in the housing 101.

When the vehicular luminaire 1 is attached to the vehicular lamp 100, the part of the mounting part 11 where the bayonet 12 is provided is inserted into the attachment hole 101a and the vehicular luminaire 1 is rotated. Then, for example, the bayonet 12 is held by the fitting part provided at the peripheral edge of the attachment hole 101a. Such an attachment method is called twist lock.

The cover 102 can be provided so as to block the opening of the housing 101. The cover 102 can be formed of a translucent resin or the like. The cover 102 is capable of functioning as a lens or the like.

The light emitted from the vehicular luminaire 1 is incident on the optical element 103. The optical element 103 is capable of, for example, reflecting, diffusing, guiding, and condensing the light emitted from the vehicular luminaire 1 and forming a predetermined luminous intensity distribution pattern. For example, the optical element 103 illustrated in FIG. 7 can be a reflector. In this case, the optical element 103 is capable of forming a predetermined luminous intensity distribution pattern by reflecting the light emitted from the vehicular luminaire 1.

The seal member 104 can be provided between the flange 13 and the housing 101. The seal member 104 is capable of having an annular shape. The seal member 104 can be formed of an elastic material such as rubber and silicone resin.

When the vehicular luminaire 1 is attached to the vehicular lamp 100, the seal member 104 is sandwiched between the flange 13 and the housing 101. Accordingly, the internal space of the housing 101 can be sealed by the seal member 104. In addition, the bayonet 12 is pressed against the housing 101 by the elastic force of the seal member 104. Accordingly, detachment of the vehicular luminaire 1 from the housing 101 can be suppressed.

The connector 105 can be fitted to the end parts of the plurality of power-supply terminals 31 exposed inside the hole 10b. The connector 105 can be electrically connected to a power-supply (not illustrated) or the like. Accordingly, the power-supply (not illustrated) or the like and the light-emitting elements 22a and 22b can be electrically connected to each other by the connector 105 being fitted to the end parts of the plurality of power-supply terminals 31.

In addition, the connector 105 is capable of having a stepped part. The seal member 105a can be attached to the stepped part. The seal member 105a can be provided so as to prevent water infiltration into the hole 10b. When the connector 105 having the seal member 105a is inserted in the hole 10b, the hole 10b is sealed so as to be watertight.

The seal member 105a is capable of having an annular shape. The seal member 105a can be formed of an elastic material such as rubber and silicone resin. The connector 105 can be bonded to an element on the socket 10 side by means of an adhesive or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A vehicular luminaire comprising:
   a socket;
   a substrate provided on one end part side of the socket;
   a frame part provided on the substrate;
   a first light-emitting element provided inside the frame part;
   a plurality of second light-emitting elements provided inside the frame part and around the first light-emitting element; and
   an optical element provided at an end part of the frame part opposite to the substrate side,
   a distance between the substrate and a light-emitting surface of the first light-emitting element being greater than a distance between the substrate and light-emitting surfaces of the plurality of second light-emitting elements.

2. The luminaire according to claim 1, wherein a surface of the optical element on the substrate side is a curved surface projecting toward the substrate side.

3. The luminaire according to claim 1, wherein the first light-emitting element is larger in thickness than the plurality of second light-emitting elements.

4. The luminaire according to claim 1, wherein the socket contains a highly heat-conductive resin.

5. A vehicular lamp comprising:
   the vehicular luminaire according to claim 1; and
   a housing to which the vehicular luminaire is attached.

6. The luminaire according to claim 1, wherein the first light-emitting element is a single light-emitting element provided in a middle region of the frame part and four of the second light-emitting elements are provided at positions in rotational symmetry about a center of the first light-emitting element when the vehicular luminaire is viewed from a direction along a central axis.

7. The luminaire according to claim 6, wherein
   the first light-emitting element is electrically connected to a wiring pattern of a tail lamp provided on the substrate, and
   the four second light-emitting elements are electrically connected to a wiring pattern of a stop lamp provided on the substrate.

8. The luminaire according to claim 1, wherein the first light-emitting element is a single light-emitting element provided in a middle region of the frame part and four of the second light-emitting elements are provided equidistantly from each other about a center of the first light-emitting element when the vehicular luminaire is viewed from a direction along a central axis.

9. The luminaire according to claim 1, wherein the first light-emitting element is a single light-emitting element provided in a middle region of the frame part and the second light-emitting element is provided at each of four end parts of a cross about a center of the first light-emitting element when the vehicular luminaire is viewed from a direction along a central axis.

10. The luminaire according to claim 1, wherein the first light-emitting element is a single light-emitting element provided in a middle region of the frame part and the second light-emitting element is provided at each of four corners of a square about a center of the first light-emitting element when the vehicular luminaire is viewed from a direction along a central axis.

11. The luminaire according to claim 1, wherein the plurality of second light-emitting elements are electrically connected in series.

12. The luminaire according to claim 1, wherein the first light-emitting element is a single light-emitting element provided in a middle region of the frame part and two of the second light-emitting elements are provided at positions in line symmetry with respect to a straight line passing through a center of the first light-emitting element as an axis of symmetry when the vehicular luminaire is viewed from a direction along a central axis.

13. The luminaire according to claim 1, wherein the first light-emitting element is a single light-emitting element provided in a middle region of the frame part and the second light-emitting element is provided at each of three corners of an equilateral triangle a center of gravity of which is a center of the first light-emitting element when the vehicular luminaire is viewed from a direction along a central axis.

14. The luminaire according to claim 1, further comprising a sealing part provided inside the frame part and between the optical element and the substrate.

15. The luminaire according to claim 1, wherein a vicinity of a peripheral edge of the optical element is provided outside the frame part.

16. The luminaire according to claim 1, wherein the optical element is a convex lens.

17. The luminaire according to claim 1, wherein a surface of the optical element on a side opposite to the substrate side is a curved surface projecting toward the side opposite to the substrate side.

18. A vehicular luminaire comprising:
a socket;
a substrate provided on one end part side of the socket;
a frame part provided on the substrate;
a first light-emitting element provided inside the frame part;
a plurality of second light-emitting elements provided inside the frame part and around the first light-emitting element; and
an optical element provided at an end part of the frame part opposite to the substrate side,
a distance between the substrate and a light-emitting surface of the first light-emitting element differing from a distance between the substrate and light-emitting surfaces of the plurality of second light-emitting elements, and
the first light-emitting element being larger in thickness than the plurality of second light-emitting elements.

19. The luminaire according to claim 18, wherein the first light-emitting element is a single light-emitting element provided in a middle region of the frame part and four of the second light-emitting elements are provided at positions in rotational symmetry about a center of the first light-emitting element when the vehicular luminaire is viewed from a direction along a central axis.

20. A vehicular lamp comprising:
the vehicular luminaire according to claim 18; and
a housing to which the vehicular luminaire is attached.

* * * * *